United States Patent
Kuo et al.

(10) Patent No.: US 9,514,991 B2
(45) Date of Patent: Dec. 6, 2016

(54) METHOD OF MANUFACTURING A FINFET DEVICE HAVING A STEPPED PROFILE

(71) Applicant: TAIWAN SEMICONDUCTOR MANUFACTURING COMPANY, LTD., Hsin-Chu (TW)

(72) Inventors: Chih-Wei Kuo, Tainan (TW);
Yuan-Shun Chao, Zhubei (TW);
Hou-Yu Chen, Zhubei (TW);
Shyh-Horng Yang, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/881,717

(22) Filed: Oct. 13, 2015

(65) Prior Publication Data

US 2016/0035625 A1    Feb. 4, 2016

Related U.S. Application Data

(62) Division of application No. 13/774,724, filed on Feb. 22, 2013, now Pat. No. 9,166,053.

(51) Int. Cl.
*H01L 29/66* (2006.01)
*H01L 29/78* (2006.01)
(Continued)

(52) U.S. Cl.
CPC ... *H01L 21/823431* (2013.01); *H01L 21/0217* (2013.01); *H01L 21/823437* (2013.01); *H01L 21/823468* (2013.01); *H01L 21/845* (2013.01);

*H01L 29/0653* (2013.01); *H01L 29/495* (2013.01); *H01L 29/6653* (2013.01);
(Continued)

(58) Field of Classification Search
CPC .................. H01L 29/66545; H01L 29/66795; H01L 29/785; H01L 21/823821
See application file for complete search history.

(56) References Cited

U.S. PATENT DOCUMENTS

| | | | |
|---|---|---|---|
| 6,686,300 B2 | 2/2004 | Mehrotra et al. | |
| 7,569,897 B2 * | 8/2009 | Anderson | ....... H01L 21/823431 257/386 |

(Continued)

*Primary Examiner* — Victor A Mandala
*Assistant Examiner* — Regan J Rundio
(74) *Attorney, Agent, or Firm* — Haynes and Boone, LLP

(57) ABSTRACT

A FinFET device and a method for fabricating a FinFET device are disclosed. An exemplary method of fabricating a FINFET device includes providing a substrate including a fin structure including a plurality of fins and shallow trench isolation (STI) features between each fin of the fin structure. A first gate structure is formed over the fin structure. First gate spacers are formed on sidewalls of the first gate structure. The first gate spacers are removed while leaving portions of the first gate spacers within corners where the fin structure and the first gate structure meet. Second gate spacers are formed on sidewalls of the first gate structure. A dielectric layer is formed over the fin structure, the first gate structure, and the second gate spacers. The first gate structure and the portions of the first gate spacers are removed, thereby exposing sidewalls of the second gate spacers. A second gate structure is formed over the fin structure in a region where the first gate structure and the portions of the first gate spacers have been removed.

20 Claims, 11 Drawing Sheets

(51) Int. Cl.

| | | |
|---|---|---|
| *H01L 29/06* | (2006.01) | |
| *H01L 29/02* | (2006.01) | |
| *H01L 21/8234* | (2006.01) | |
| *H01L 21/336* | (2006.01) | |
| *H01L 27/088* | (2006.01) | |
| *H01L 21/28* | (2006.01) | |
| *H01L 21/762* | (2006.01) | |
| *H01L 21/02* | (2006.01) | |
| *H01L 21/84* | (2006.01) | |
| *H01L 29/49* | (2006.01) | |

(52) U.S. Cl.
CPC .... *H01L 29/6681* (2013.01); *H01L 29/66545* (2013.01); *H01L 29/66795* (2013.01); *H01L 29/785* (2013.01); *H01L 29/7851* (2013.01); *H01L 29/7856* (2013.01)

(56) References Cited

U.S. PATENT DOCUMENTS

| | | | |
|---|---|---|---|
| 7,625,790 B2 | 12/2009 | Yang | |
| 7,700,449 B2 | 4/2010 | Lee | |
| 7,888,750 B2 | 2/2011 | Anderson et al. | |
| 8,310,013 B2 | 11/2012 | Lin et al. | |
| 8,329,546 B2* | 12/2012 | Lee | H01L 21/28114 257/E21.19 |
| 8,502,289 B2* | 8/2013 | Wang | H01L 29/66795 257/288 |
| 8,592,264 B2* | 11/2013 | Ando | H01L 29/78621 257/408 |
| 9,153,669 B2* | 10/2015 | Anderson | H01L 29/6681 |
| 2006/0175669 A1 | 8/2006 | Kim et al. | |
| 2007/0134884 A1 | 6/2007 | Kim et al. | |
| 2008/0296667 A1 | 12/2008 | Mikasa | |
| 2009/0020792 A1 | 1/2009 | Rios et al. | |
| 2009/0026543 A1* | 1/2009 | Yang | H01L 21/845 257/365 |
| 2009/0309162 A1* | 12/2009 | Baumgartner | H01L 29/66818 257/368 |
| 2010/0187575 A1* | 7/2010 | Baumgartner | H01L 21/823431 257/255 |
| 2012/0146157 A1 | 6/2012 | Baumgartner et al. | |
| 2013/0161763 A1* | 6/2013 | Ando | H01L 29/78621 257/408 |
| 2013/0193513 A1 | 8/2013 | Bryant et al. | |

* cited by examiner

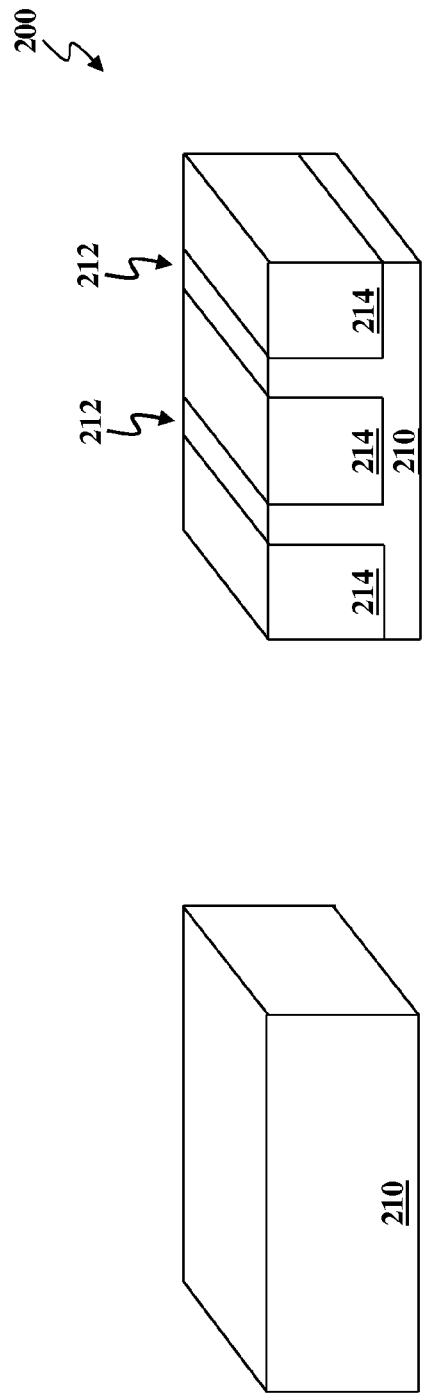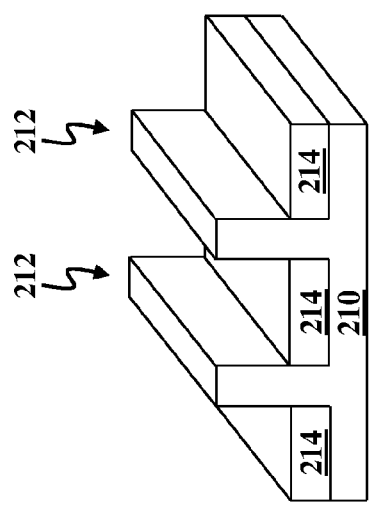

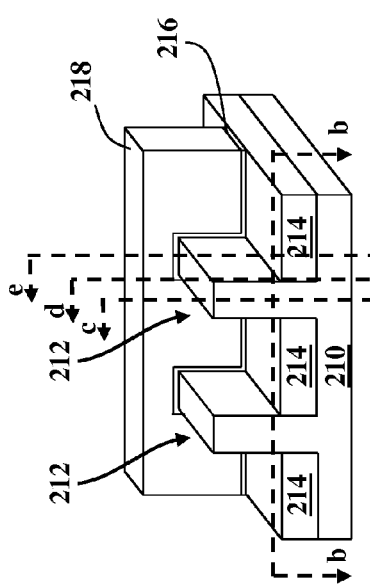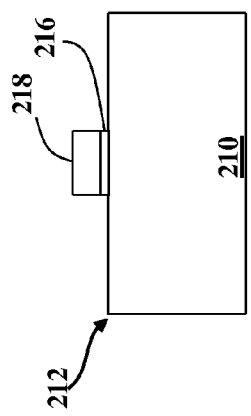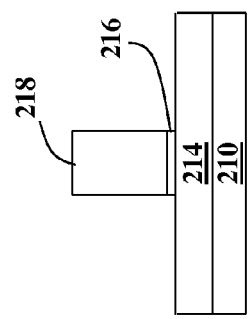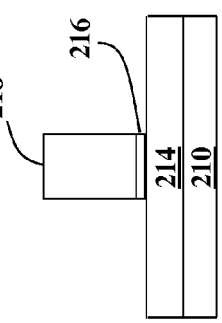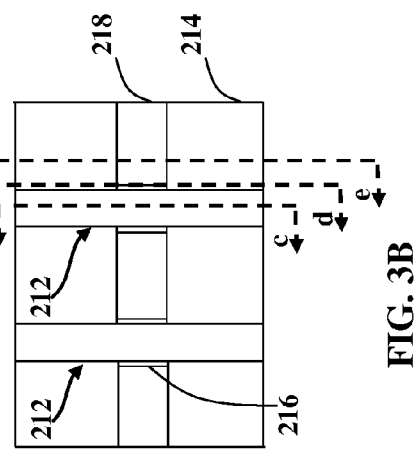

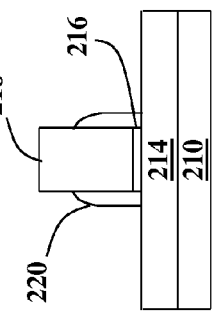
FIG. 5C
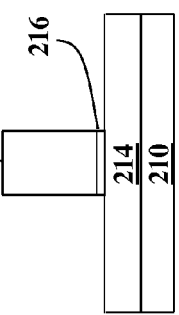
FIG. 5D
FIG. 5E
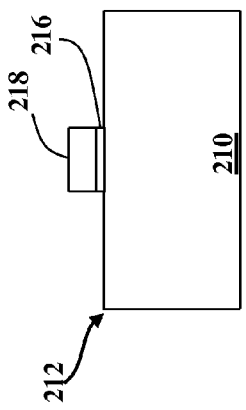
FIG. 5A
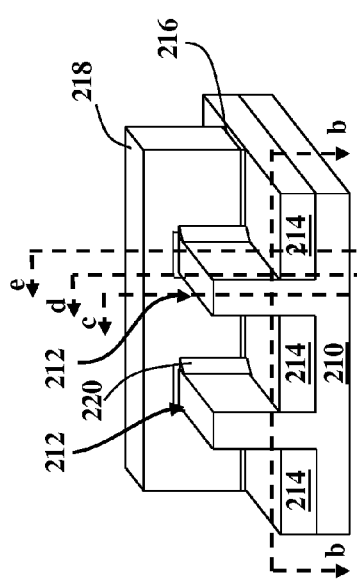
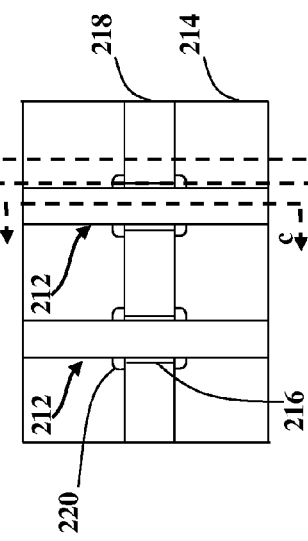
FIG. 5B

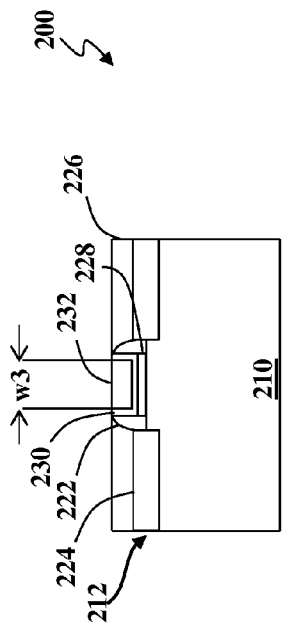
FIG. 11C
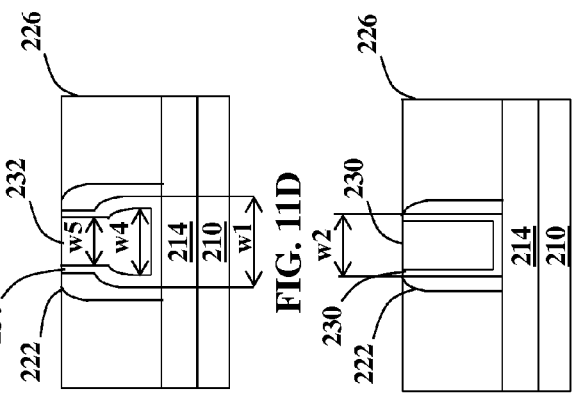
FIG. 11D
FIG. 11E
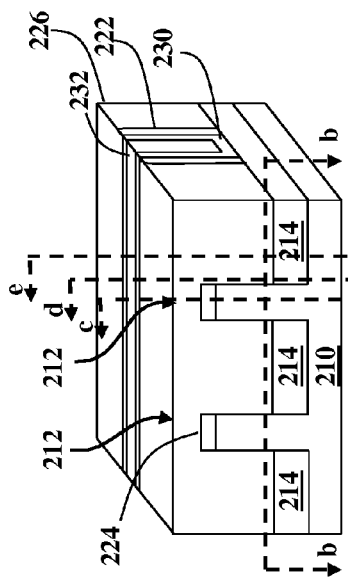
FIG. 11A
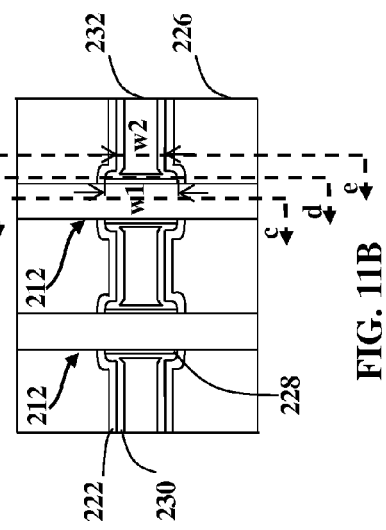
FIG. 11B

METHOD OF MANUFACTURING A FINFET DEVICE HAVING A STEPPED PROFILE

CROSS-REFERENCE TO RELATED APPLICATIONS

This application is a divisional of U.S. application Ser. No. 13/774,724, filed on Feb. 22, 2013, titled "A FINFET Device Including a Stepped Profile Structure," now U.S. Pat. No. 9,166,053, issued Oct. 20, 2015, the entire disclosure of which is incorporated herein by reference.

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into nanometer technology process nodes in pursuit of higher device density, higher performance, and lower costs, challenges from both fabrication and design have resulted in the development of three-dimensional (3D) devices such a fin-like field effect transistors (FinFETs). Current methods of forming FinFET devices, however, fail to adequately provide FinFET devices that have uniform voltage thresholds in the channel region. Accordingly, although existing FinFET devices and methods of fabricating FinFET devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A to 2C and 3A to 11A illustrate diagrammatic perspective views of one embodiment of a semiconductor device at various stages of fabrication, according to the method of FIG. 1.

FIGS. 3B to 11B illustrate diagrammatic cross-sectional top views of the semiconductor device, illustrated in FIGS. 3A to 11A, respectively.

FIGS. 3C, 3D, and 3E to 11C, 11D, and 11E illustrate diagrammatic cross-sectional side views of the semiconductor device, illustrated in FIGS. 3A to 11A, respectively.

DETAILED DESCRIPTION

Figure 1:
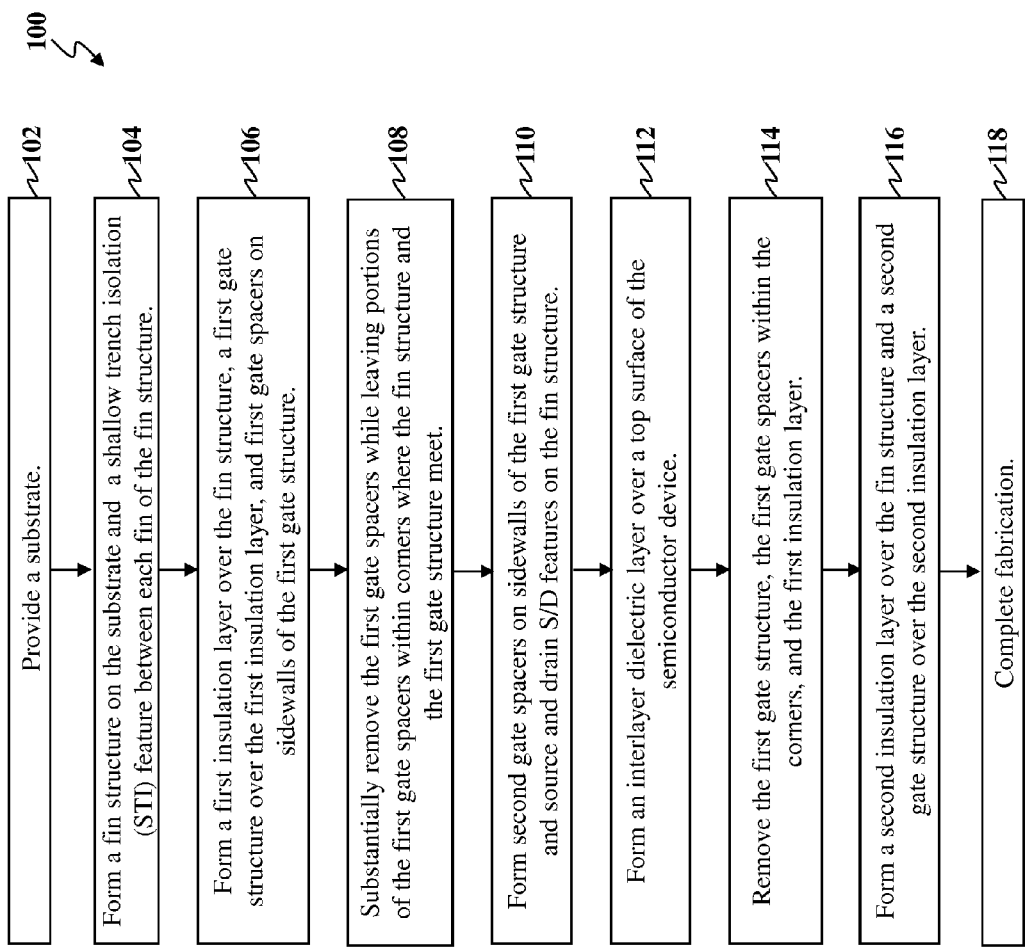
FIG. 1 is a flowchart illustrating a method of fabricating a semiconductor device according to various aspects of the present disclosure.
Figure 4A:
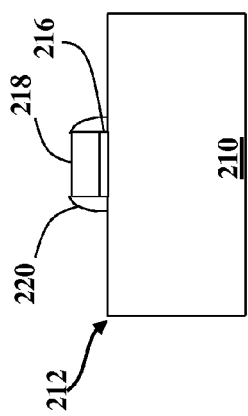
Figure 4B:
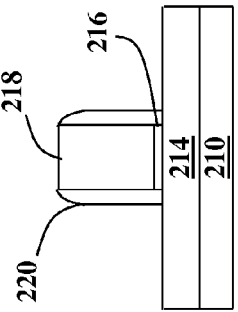
Figure 4C:
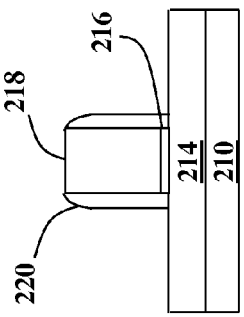
Figure 4D:
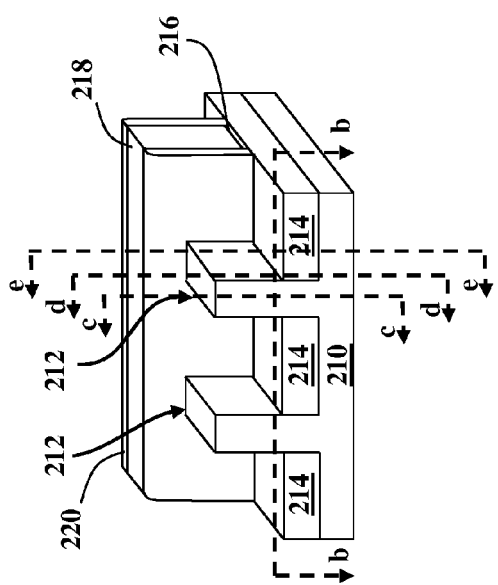
Figure 4E:
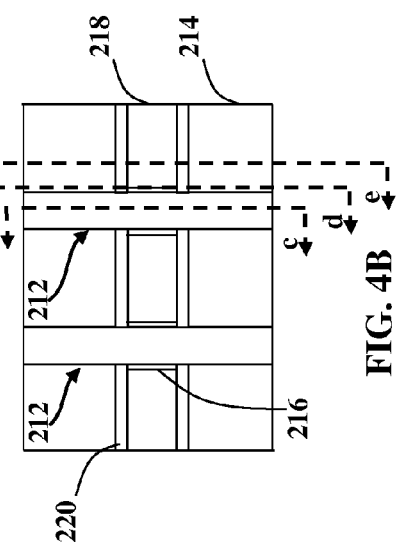
Figure 6A:
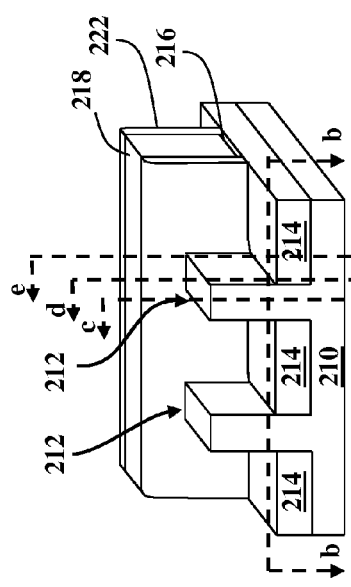
Figure 6B:
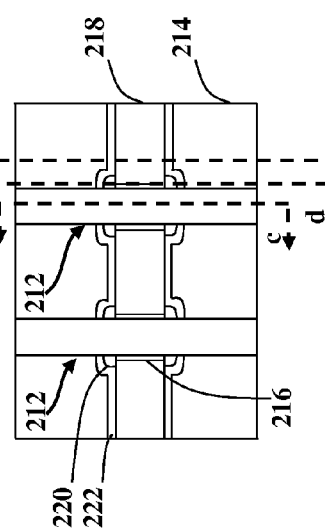
Figure 6C:
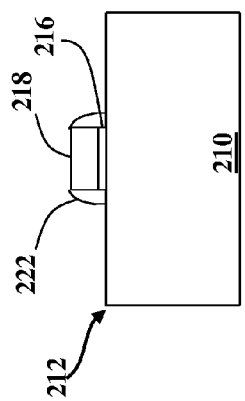
Figure 6D:
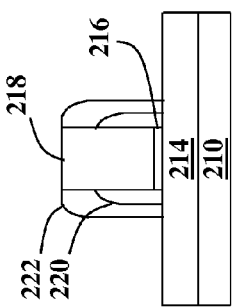
Figure 6E:
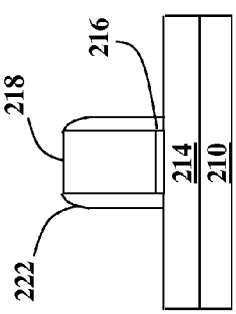
Figure 7A:
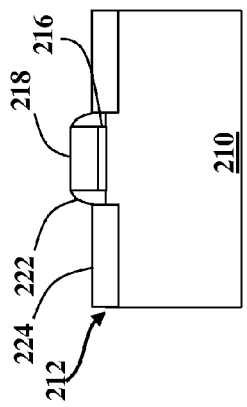
Figure 7B:
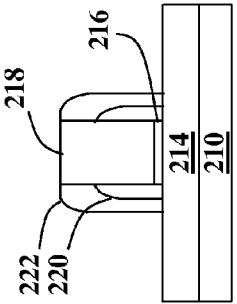
Figure 7C:
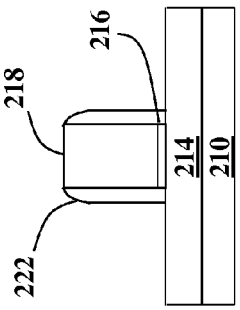
Figure 7D:
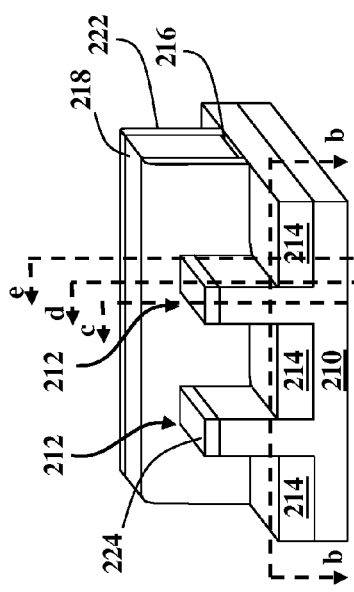
Figure 7E:
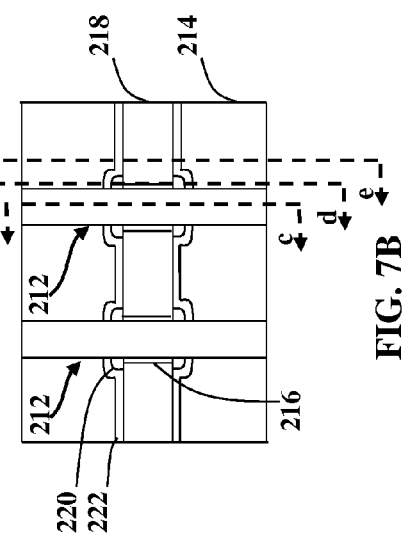
Figure 8C:
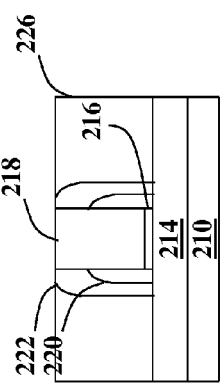
Figure 8D:
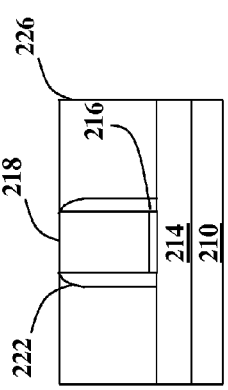
Figure 8E:
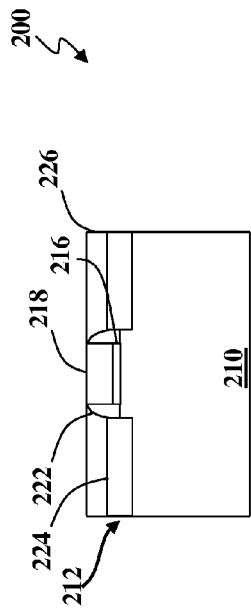
Figure 8A:
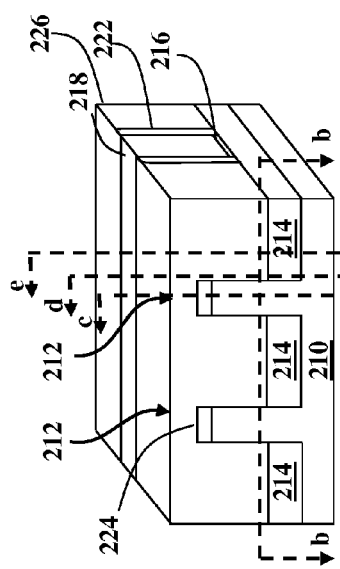
Figure 8B:
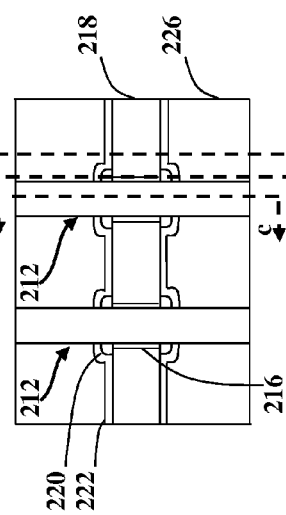
Figure 9C:
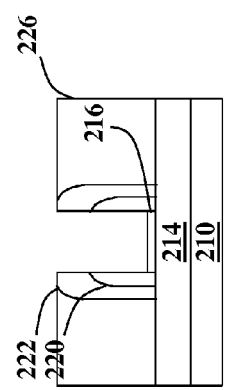
Figure 9D:
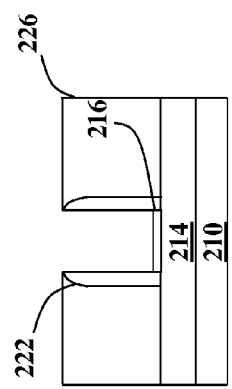
Figure 9E:
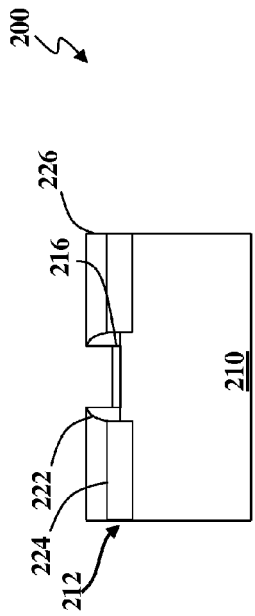
Figure 9A:
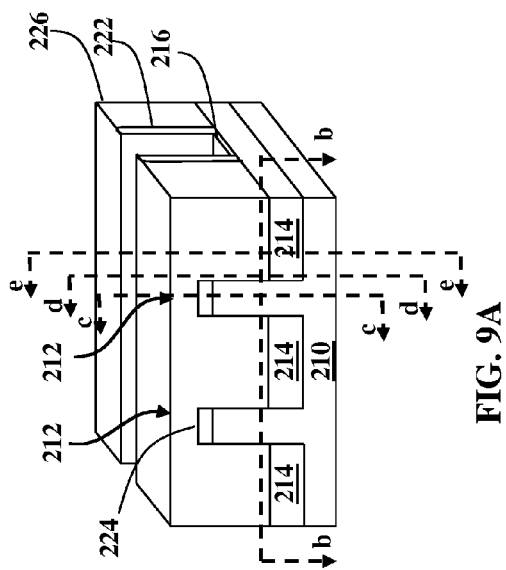
Figure 9B:
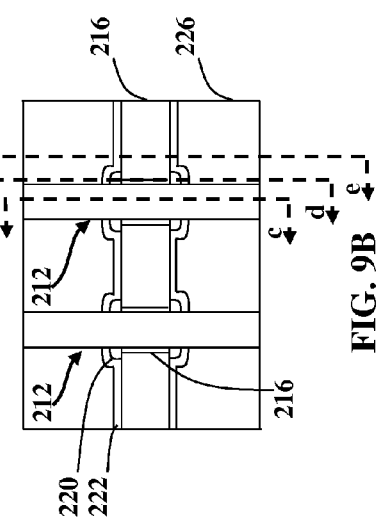
Figure 10A:
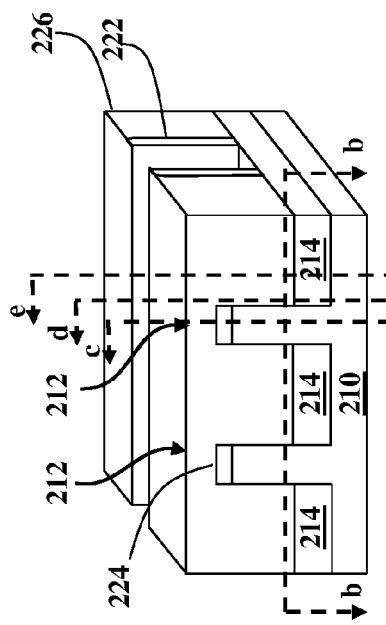
Figure 10B:
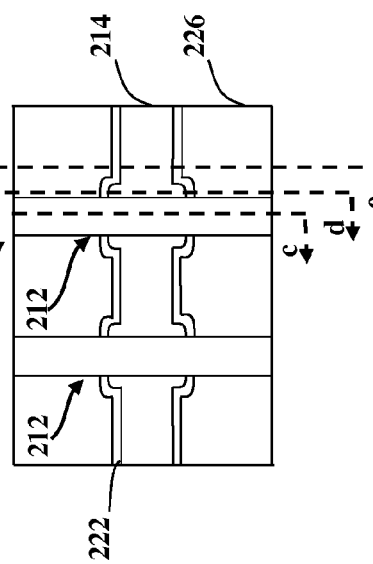
Figure 10C:
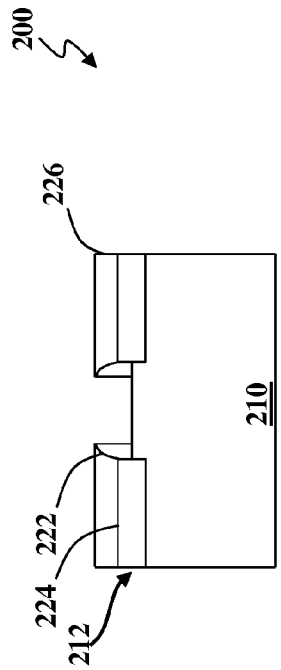
Figure 10D:
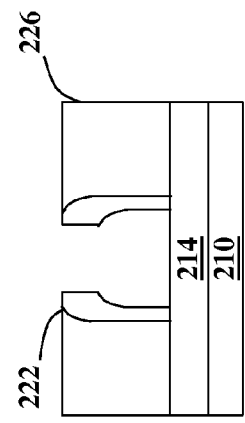
Figure 10E:
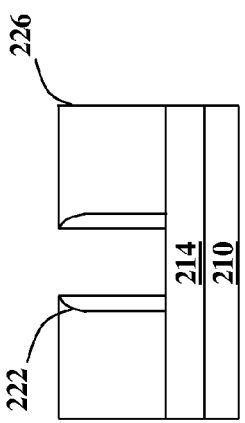

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

Examples of devices that can benefit from one or more embodiments of the present application are semiconductor devices. Such a device, for example, is a fin-like field effect transistor (FinFET). The FinFET device, for example, may be a P-type metal-oxide-semiconductor (PMOS) FinFET device, an N-type metal-oxide-semiconductor (NMOS) FinFET device, or a complementary metal-oxide-semiconductor (CMOS) device. The following disclosure will continue with a FinFET device example to illustrate various embodiments of the present application. It is understood, however, that the application should not be limited to a particular type of device, except as specifically claimed.

With reference to FIGS. 1 and 2-11, a method 100 and a semiconductor device 200 are collectively described below. FIG. 1 is a flow chart of a method 100 for fabricating an integrated circuit device according to various aspects of the present disclosure. In the present embodiment, the method 100 is for fabricating an integrated circuit device that includes a FinFET device. The method 100 begins at block 102 where a substrate is provided. At block 104, a fin structure is formed over the substrate. The formation of the fin structure may include patterning a mask layer, etching the semiconductor substrate using the mask layer to define the fin structure and forming shallow trench isolation (STI) features between each fin of the fin structure. Forming the STI feature may include depositing a dielectric layer over the fin structure and etching back the dielectric layer thereby exposing sidewalls of the fin structure. During the formation of the fin structure, the fin structure may be implanted with a material, such a germanium, carbide, or any appropriate material to thereby form well, lightly doped source/drain (LDD) regions, and heavily doped source/drain (HDD) regions within the fin structure. The method continues with block 106 where an insulation layer is formed on the fin structure, a dummy gate structure is formed over the insulation layer, and dummy gate spacers are formed on sidewalls of the dummy gate structure. The insulation layer may be formed such that it traverses the fin structure. The method continues with block 108 where the dummy gate spacers are substantially removed while leaving dummy gate spacers within corners where the fin structure and the dummy gate structure meet. The method continues with block 110 where gate spacers are formed on sidewalls of the dummy gate structure and where source and drain S/D features are formed on the fin structure. The method continues with block 112 where an interlayer dielectric (ILD) layer is formed over the semiconductor device. A chemical mechanical polishing (CMP) process may be subsequently performed to remove excess dielectric material and planarize a top surface of the semiconductor device. The method continues with block 114 where the dummy gate structure, the dummy gate spacers within the corners, and the insulation layer are removed. The method continues with block 116 where an insulation layer is formed over the fin structure and between the gate spacers and a gate structure is formed over the insulation layer. The second insulation layer may be formed by thermal oxidation of the fin structure or by deposition of a dielectric material. The gate structure traverses the fin structure and separates the S/D features. The method 100 continues with block 118 where fabrication of the integrated circuit device is completed. Additional steps can be provided before, during, and after the method 100, and some of the steps described can be replaced or eliminated for other embodiments of the method. The discussion that follows illustrates various embodiments of an integrated circuit device that can be fabricated according to the method 100 of FIG. 1.

FIGS. 2A, 2B, 2C and 3A to 11A illustrate perspective views of one embodiment of a semiconductor device at various stages of fabrication, according to the method of FIG. 1; FIGS. 3B to 11B illustrate diagrammatic cross-sectional top views of the semiconductor device, illustrated in FIGS. 3A to 11A, respectively; and FIGS. 3C, 3D, and 3E to 11C, 11D, and 11E illustrate diagrammatic cross-sectional side views of the semiconductor device, illustrated in FIGS. 3A to 11A, respectively. The FinFET device 200 may be included in a microprocessor, memory cell, and/or other integrated circuit device. It is noted that FIGS. 2-11 have been simplified for the sake of clarity to better understand the concepts of the present disclosure. Additional features can be added in the FinFET device 200, and some of the features described below can be replaced or eliminated in other embodiments of the semiconductor device 200.

Referring to FIG. 2A, a substrate (e.g., wafer) 210 is provided. The substrate 210 may be a bulk substrate comprising an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Alternatively, the substrate 210 includes a silicon-on-insulator (SOI) substrate. The SOI substrate can be fabricated using separation by implantation of oxygen (SIMOX), wafer bonding, and/or other suitable methods.

Referring to FIG. 2B, a fin structure 212 is formed within the substrate 210. Fin structure 212 (including a plurality of fins) is formed by any suitable process, such as a photolithography and etching process. For example, in the present embodiment, the fin structure 212 is formed by exposing a photoresist layer to a pattern, performing a post-exposure bake process, and developing the photoresist layer to form a pattern. The photoresist layer patterning may include processing steps of photoresist coating, soft baking, mask aligning, exposing pattern, post-exposure baking, developing photoresist, and hard baking. The patterning may also be implemented or replaced by other proper methods, such as maskless photolithography, electron-beam writing, ion-beam writing, and molecular imprint. The patterned photoresist layer may then be used in an etching process to etch the fin structure 212 into the substrate 210. The etching process uses the patterned photoresist layer to define the area to be etched and to protect other regions of the FinFET device 200. The etching process may include a wet etching process, a dry etching process, or a combination thereof. The fin structure 212 may be formed by an etching process using a reactive ion etch (RIE) and/or other suitable process. In one example, a dry etching process used to etch the substrate 210 includes a chemistry including fluorine-containing gas. In furtherance of the example, the chemistry of the dry etch includes CF4, SF6, or NF3. Alternatively, the fin structure 212 is formed by a double-patterning lithography (DPL) process. DPL is a method of constructing a pattern on a substrate by dividing the pattern into two interleaved patterns. DPL allows enhanced feature (e.g., fin) density. Various DPL methodologies may be used including double exposure (e.g., using two mask sets). The fin structure 212 may be implanted with a material, such a germanium, carbide, or any appropriate material to thereby form well regions therein.

With further reference to FIG. 2B, a STI feature 214 is formed between each fin of the fin structure 212. Forming the STI feature 214 may include forming a dielectric layer by any suitable process. The STI feature 214 may include multiple layers of different dielectric materials. In the present embodiment, the STI feature 214 includes a dielectric material such as silicon oxide and is formed by any suitable process. In various examples, the silicon oxide can be formed by, wet or dry thermal oxidation, physical vapor deposition (PVD), atomic layer deposition (ALD), high density plasma CVD (HDPCVD), other suitable methods, and/or combinations thereof. The CVD process, for example, may use chemicals including Hexachlorodisilane (HCD or Si2Cl6), Dichlorosilane (DCS or SiH2Cl2), Bis (TertiaryButylAmino) Silane (BTBAS or C8H22N2Si) and Disilane (DS or Si2H6). The STI feature 214 may have a multilayer structure, for example, a thermal oxide liner layer with silicon oxide or silicon nitride formed over the liner.

Referring to FIG. 2C, the dielectric material of the STI feature 214 is recessed between the fins of the fin structure 212 thereby exposing sidewalls of the fin structure 212. Recessing the dielectric material of the STI feature 214 may include an etching process. The etching process may include a wet etching process, a dry etching process, or a combination thereof. In one example, a wet etching process including hydrofluoric acid (HF) or buffered HF may be used to etch the dielectric material of the STI feature 214.

FIG. 3A illustrates a diagrammatic perspective view of one embodiment of a semiconductor device 200; FIG. 3B illustrates a diagrammatic cross-sectional top view of the semiconductor device illustrated in FIG. 3A taken along line b-b; and FIGS. 3C, 3D, and 3E illustrate diagrammatic cross-sectional side views of the semiconductor device illustrated in FIG. 3A taken along lines c-c, d-d, and e-e, respectively. As illustrated in FIG. 3A, line c-c is substantially along a centerline of one fin (the right fin) of the fin structure 212, line d-d is at a first distance from the centerline, and line e-e is at a second distance from the centerline; the second distance is greater than the first distance.

Referring to FIGS. 3A-3E, formed over the semiconductor device 200 is a first insulation layer 216. The first insulation layer 216 traverses the fin structure 212 and is formed on a central portion of the fin structure 212 and the STI feature 214. The first insulation layer 216 may include any suitable dielectric material. The first insulation layer 216 may be formed by a suitable process, including deposition, lithography patterning, and etching processes. In various examples, the first insulation layer 216 can be formed by, wet or dry thermal oxidation, physical vapor deposition (PVD), atomic layer deposition (ALD), high density plasma CVD (HDPCVD), other suitable methods, and/or combinations thereof. In the present embodiment, the first insulation layer 216 includes silicon oxide and is formed by an ALD process.

Still referring to FIGS. 3A-3E, formed over the first insulation layer 216 is a first gate structure 218. In the present embodiment the first gate structure 218 is a dummy gate structure that will be subsequently removed. The first gate structure 218 may be formed of any suitable material such as polysilicon. The gate structure 218 is formed by a suitable process, including deposition, lithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography exposing process is implemented or replaced by other methods, such as maskless photolithography, electron-beam writing, and ion-beam writing. In yet another alternative, the lithography patterning process could implement nanoimprint technology. The etching processes may include dry etching, wet etching, a combination of both dry and wet etching, and/or other etching methods. After the formation of the first gate structure 218, the exposed portions of the fin structure 212 may be implanted with a material, such a germanium, carbide, or any appropriate material to thereby form a lightly doped source/drain (LDD) regions therein.

Referring to FIGS. 4A-4E, formed on sidewalls of the first gate structure 218 are first gate spacers 220. In the present embodiment, the first gate spacers 220 are dummy spacers that will be removed in subsequent processing. The first gate spacers 220 may be formed by a suitable process and may include any suitable dielectric material such as silicon oxide, silicon nitride, or any suitable material. To reduce subsequent etching processing steps, for example, the first gate spacers 220 may include a dielectric material that is the same as the dielectric material of the first insulation layer 216. In the present embodiment, the first gate spacers 220 include silicon oxide. After the formation of the first gate spacers 220, the exposed portions of the fin structure 212 may be implanted with a material, such a germanium, carbide, or any appropriate material to thereby form a heavily doped source/drain (HDD) regions therein.

Referring to FIGS. 5A-5E, the first gate spacers 220 are substantially removed from the sidewalls of the first gate structure 218, while leaving portions of the first gate spacers 220 within vertically oriented corners where the fin structure 216 and the first gate structure 218 meet. The first gate spacers 220 may be substantially removed by any suitable process. In the present embodiment the first gate spacers 220 are substantially removed by an etching process. The etching processes may include dry etching, wet etching, a combination of both dry and wet etching, and/or other etching methods.

Referring to FIGS. 6A-6E, formed on sidewalls of the first gate structure 218 and over the first gate spacers 220 in the corners are second gate spacers 222. The second gate spacers 222 may be formed by a suitable process and may include any suitable dielectric material such as silicon oxide, silicon nitride, or any suitable material. To allow for further processing of the first gate spacers 220 that remain within the corners where the fin structure 212 and the first gate structure 218 meet, the second gate spacers 222 are formed of a material different from the material of the first gate spacers 220. In the present embodiment, the second gate spacers 222 include silicon nitride.

Referring to FIGS. 7A-7E, formed on a top surface of the fin structure 218 are source and drain (S/D) features 224 separated by a channel region underlying the first gate structure 218. The S/D feature 224 may include highly doped regions and lightly doped regions. In one embodiment, forming the S/D features 224 includes etching a top portion of the fin structure 218 and depositing a doped semiconductor material over the etched portion of the fin structure 218. The deposition of the doped semiconductor material may include epitaxially (epi) growing a semiconductor material such as silicon germanium (SiGe), silicon carbide (SiC), or any suitable material.

Referring to FIGS. 8A-8E, formed on the semiconductor device 200 is an interlayer dielectric (ILD) layer 226. The ILD layer 226 may include silicon nitride, silicon oxide, silicon oxynitride, a low-k material such as fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The ILD layer 226 may be formed by any suitable processing including chemical vapor deposition (CVD), high density plasma CVD (HDP-CVD), spin-on, physical vapor deposition (PVD or sputtering), or other suitable methods. The CVD process, for example, may use chemicals including Hexachlorodisilane (HCD or $Si_2Cl_6$), Dichlorosilane (DCS or $SiH_2Cl_2$), Bis(TertiaryButylAmino) Silane (BTBAS or $C_8H_{22}N_2Si$) and Disilane (DS or $Si_2H_6$).

Referring to FIGS. 9A-9E, the first gate structure 218 is removed. The first gate structure 218 may be removed by any suitable process. In the present embodiment the first gate structure 218 is removed by an etching process. The etching processes may include dry etching, wet etching, a combination of both dry and wet etching, and/or other etching methods.

Referring to FIGS. 10A-10E, the first insulation layer 216 and the portions of the first gate spacers 220 are removed exposing sidewalls of the fin structure 212 and a top surface of the STI feature 214. The first insulation layer 216 and the portions of the first gate spacers 220 may be removed by any suitable process. In the present embodiment the first insulation layer 216 and the portions of the first gate spacers 220 are removed by an etching process. The etching processes may include dry etching, wet etching, a combination of both dry and wet etching, and/or other etching methods. In one example, a dry etching process used to remove the first insulation layer 216 and the portions of the first gate spacers 220 may include a chemistry including fluorine-containing gas. In furtherance of the example, the chemistry of the dry etch includes $CF_4$, $SF_6$, or $NF_3$. Notably, because in the present embodiment both the first insulation layer 216 and the portions of the first gate spacers 220 include silicon oxide, removal of both the first insulation layer 216 and the portions of the first gate spacers 220 can be performed at the same time. In alternative embodiments, where the first insulation layer 216 and the portions of the first gate spacers 220 include different materials, the removal process is a multistep process that includes first removing the first insulation layer 216 and then removing the first gate spacers 220.

Referring to FIGS. 11A-11E, a second insulation layer 228 is formed. In the present embodiment, the second insulation layer 228 functions as an interfacial layer used to interface and protect the fin structure 212. The second insulation layer 226 is formed such that it traverses the fin structure 212 on a central portion of the fin structure 212 (see e.g., FIGS. 11B and 11C) separating the S/D regions 224. The second insulation layer 228 may include any suitable dielectric material such as silicon oxide, silicon nitride, or any suitable material. The second insulation layer 228 may be formed by a suitable process. In various examples, the second insulation layer 228 can be formed by, wet or dry thermal oxidation, physical vapor deposition (PVD), atomic layer deposition (ALD), high density plasma CVD (HDP-CVD), other suitable methods, and/or combinations thereof. In the present embodiment, the second insulation layer 228 includes silicon oxide and is formed by a thermal oxidation process. Because, in the present embodiment, the second insulation layer 226 is formed by thermal oxidation, the second insulation layer 228 is only formed on exposed portions (e.g., top surface and sidewalls) of the fin structure 212, but is not formed on the exposed top surface of the dielectric layer 214 (see e.g., FIGS. 11D and 11E).

Still referring to FIGS. 11A-11E, a gate dielectric 230 and a gate structure 232 are formed over the second insulation layer 228. The gate dielectric 230 includes a dielectric material, such as silicon oxide, high-k dielectric material, other suitable dielectric material, or combinations thereof. Examples of high-k dielectric material include HfO2, HfSiO, HfSiON, HfTaO, HfTiO, HfZrO, zirconium oxide, aluminum oxide, hafnium dioxide-alumina (HfO2-Al2O3) alloy, other suitable high-k dielectric materials, and/or combinations thereof. In the present embodiment, the gate dielectric 230 is a high-k dielectric layer comprising $HfO_x$. The gate structure 232 may include polysilicon and/or a metal including Al, Cu, Ti, Ta, W, Mo, TaN, NiSi, CoSi, TiN, WN, TiAl, TiAlN, TaCN, TaC, TaSiN, other conductive materials, or combinations thereof. The gate structure 232 may include numerous other layers, for example, a work function metal layer, capping layers, interface layers, diffusion layers, barrier layers, or combinations thereof. A hardmask layer may be formed over the gate structure 232. The hardmask layer may include silicon oxide, silicon nitride, silicon oxynitride, silicon carbide, other suitable material, or combinations thereof.

The gate dielectric 230 and a gate structure 232 may be formed by any suitable processes. For example, the gate dielectric 230 may be formed using a suitable process such as atomic layer deposition (ALD), chemical vapor deposition (CVD), physical vapor deposition (PVD), thermal oxidation, UV-ozone oxidation, or combinations thereof. Further, for example, the gate structure 232 may be formed by a deposition process, including chemical vapor deposition (CVD), physical vapor deposition (PVD), atomic layer deposition (ALD), high density plasma CVD (HDPCVD), metal organic CVD (MOCVD), remote plasma CVD (RP-CVD), plasma enhanced CVD (PECVD), low-pressure CVD (LPCVD), atomic layer CVD (ALCVD), atmospheric pressure CVD (APCVD), plating, other suitable methods, or combinations thereof.

Still referring to FIGS. 11A-11E, a planarizing process is performed on the semiconductor device 200. In one embodiment, the planarizing process includes a chemical mechanical polishing (CMP) process applied to the semiconductor device 200 to remove excessive portions of the gate dielectric 230 and a gate structure 232. The planarizing process may be performed such that excess material of the gate dielectric 230 and the gate structure 232 is removed, thus exposing a substantially planarized top surface of each fin of the fin structure 212.

Thus, illustrated in FIGS. 11A to 11E is a semiconductor device 200. In the present embodiment, the semiconductor device 200 is a FinFET device. The FinFET device 200 includes a substrate 210 having a fin structure 212 formed thereon. Each fin of the fin structure 212 is separated/isolated by an STI feature 214. Each fin of the fin structure 212 includes an isolation layer 228 traversing each fin in a central region, a gate dielectric 230 formed over the second isolation layer 228, and a gate structure 232 traversing each fin and formed over the gate dielectric 230. Disposed on sidewalls of the gate structure 232 are gate spacers 222. The gate spacers 222 are not linear and have a longitudinal stepped profile adjacent to the fin structure 212, which allows for the gate structure 232 to have a greater effective gate length. The gate structure 232 separates source/drain (S/D) regions 224 and overlies a channel region. Each fin of the fin structure 212 may include a well region, lightly doped source/drain (LDD) regions, and heavily doped source/drain (HDD) regions. The gate dielectric 230 has a width (w1) at a first distance (i.e., along line d-d) from a centerline (i.e., along line c-c) of one fin of the fin structure 212 that is greater than a width (w2) at a second distance (i.e., along line e-e) from the centerline, the second distance being greater than the first distance. The width (w1) is at least 3% greater than the width (w2). In the current embodiment, the width (w1) is about 3% to about 10% greater than the width (w2). Further, the gate structure 232 has a longitudinal stepped profile including varying widths such that the gate structure 232 has a width (w3) at the centerline that is less than a width (w4) at the first distance from the centerline. The width (w4) is at least 3% greater than the width (w3). In the current embodiment, the width (w4) is about 3% to about 10% greater than the width (w3). Also, the gate structure 232 has a width (w5) that is less than the width (w4) at the second distance from the centerline, the width (w5) being measured at a point above the where the width (w4) is measured at the first distance from the center line. The width (w4) is at least 3% greater than the width (w5). In the current embodiment, the width (w4) is about 3% to about 10% greater than the width (w5).

The semiconductor device 200 may include additional features, which may be formed by subsequent processing. For example, various contacts/vias/lines and multilayer interconnect features (e.g., metal layers and interlayer dielectrics) may be formed over the substrate 210, configured to connect the various features or structures of the semiconductor device 200. The additional features may provide electrical interconnection to the semiconductor device 200. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure. It is understood that the semiconductor device 200 may be included in a semiconductor device/integrated circuit that includes other features and structures such as transistors, capacitors, resistors, inductors, passivation layers, bonding pads, packaging, etc., but the illustrated embodiments are simplified for the sake of simplicity and clarity.

The above method 100 and semiconductor device 200 provides for improved voltage threshold in the channel direction (along the length of the fin structure 212 between the S/D feature 224) because of a greater effective gate length. For example, because of the stepped gate profile (e.g., greater width w4) gate cornering rounding is minimized resulting in greater effective gate length, when compare to effective gate lengths of traditional devices, which allows for better LDD region push into the channel region thereby improving voltage threshold uniformity in the channel direction.

Thus, provided is a FinFET device. An exemplary FinFET device includes a substrate including a fin structure, the fin structure including a first and a second fin. The FinFET device further includes a shallow trench isolation (STI) feature disposed on the substrate and between the first and the second fins. The FinFET device further includes a gate dielectric disposed on the first and the second fins. The FinFET device further includes a gate structure disposed on the gate dielectric. The gate structure traverses the first fin, the second fin, and the STI feature between the first fin and the second fin and has a longitudinal stepped profile.

In some embodiments, the FinFET device further includes an interfacial layer interposed between the fin structure and the gate dielectric; and gate spacers disposed on sidewalls of the gate structure, the gate spacers having a longitudinal stepped profile that corresponds with the longitudinal stepped profile of the gate structure.

In some embodiments, the interfacial layer is disposed on the fin structure without being disposed on the STI feature. In various embodiments, the longitudinal stepped profile of the gate structure has a first width at a first distance from a centerline of the first fin and a second width at a second distance from the centerline of the first fin, the second distance being greater than the first distance, and the first width being greater than the second width. In certain embodiments, the interfacial layer includes silicon oxide, and the gate spacers include silicon nitride. In further embodiments, the semiconductor substrate is a bulk silicon substrate. In some embodiments, the gate structure includes a material selected from the group consisting of Al, Cu, and W.

Also provided is an alternative embodiment of a FinFET device. The exemplary FinFET device includes a semiconductor substrate. The FinFET device further includes a fin structure including one or more fins formed on the semiconductor substrate. The FinFET device further includes an isolation material formed between each of the one or more fins. The FinFET device further includes a dielectric layer formed on a portion of the fin structure and a gate structure formed on the dielectric layer. The FinFET device further includes gate spacers formed on sidewalls of the gate structure. The gate structure has a longitudinal stepped profile.

In some embodiments, the dielectric layer is formed on the portion of the fin structure without being formed on the isolation material between the one or more fins of the fin structure. In various embodiments, the longitudinal stepped profile of the gate structure has a first width at a first distance from a centerline of a first fin of the one or more fins of the fin structure and a second width at a second distance from the centerline of the first fin, the second distance being greater than the first distance, and the first width being greater than the second width. In certain embodiments, the dielectric layer includes silicon oxide, and the gate spacers include silicon nitride. In further embodiments, the semiconductor substrate is one of a bulk silicon substrate or a silicon-on-insulator (SOI) substrate. In some embodiments, the gate structure includes a material selected from the group consisting of Al, Cu, and W.

Also provided is a method of forming a FinFET device. The exemplary method includes providing a substrate including a fin structure, the fin structure including a first and a second fin. The method further includes, forming a shallow trench isolation (STI) feature between the first and the second fins. The method further includes, forming a gate dielectric on the first and the second fins and forming a gate structure on the gate dielectric. The gate structure traverses the first fin, the second fin, and the STI feature between the first fin and the second fin. The gate structure has a longitudinal stepped profile.

In some embodiments, the method further includes forming an interfacial interposed between the fin structure and the gate dielectric and forming gate spacers on sidewalls of the gate structure. The gate spacers have a longitudinal stepped profile that corresponds with the longitudinal stepped profile of the gate structure.

In some embodiments, the interfacial layer is disposed on the fin structure without being disposed on the STI feature. In various embodiments, the longitudinal stepped profile of the gate structure has a first width at a first distance from a centerline of the first fin and a second width at a second distance from the centerline of the first fin, the second distance being greater than the first distance, and the first width being greater than the second width. In certain embodiments, forming the interfacial layer includes forming silicon oxide and forming the gate spacers includes depositing silicon nitride. In further embodiments, providing the semiconductor substrate includes providing one of a bulk silicon substrate or a silicon-on-insulator (SOI) substrate. In some embodiments, forming the gate structure includes depositing a material selected from the group consisting of Al, Cu, and W.

Also provided is an alternative method of forming a FinFET device. The exemplary method includes providing a substrate including a fin structure including a plurality of fins and shallow trench isolation (STI) features between each fin of the fin structure. The method further includes forming a first gate structure over the fin structure. The method further includes forming first gate spacers on sidewalls of the first gate structure. The method further includes removing the first gate spacers while leaving portions of the first gate spacers within corners where the fin structure and the first gate structure meet. The method further includes forming second gate spacers on sidewalls of the first gate structure. The method further includes forming a dielectric layer over the fin structure, the first gate structure, and the second gate spacers. The method further includes removing the first gate structure and the portions of the first gate spacers thereby exposing sidewalls of the second gate spacers. The method further includes forming a second gate structure over the fin structure in a region where the first gate structure and the portions of the first gate spacers have been removed.

In some embodiments, the method further includes forming a insulation layer interposed between the first gate structure and the fin structure and forming a gate dielectric layer interposed between the second gate structure and the fin structure. In various embodiments, the method further includes forming an interfacial layer interposed between the gate dielectric layer and the fin structure.

In some embodiments, the interfacial layer is disposed on the fin structure without being disposed on the STI features. In various embodiments, forming the interfacial layer includes forming silicon oxide and forming the second gate spacers includes depositing silicon nitride. In certain embodiments, providing the substrate includes providing one of a bulk silicon substrate or a silicon-on-insulator (SOI) substrate. In further embodiments, forming the second gate structure includes depositing a material selected from the group consisting of Al, Cu, and W.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a FinFET device, comprising:
    providing a substrate including a fin structure and shallow trench isolation (STI) features, the fin structure including a plurality of fins, the STI features being between each fin of the fin structure;
    forming a first gate structure over the fin structure;
    forming first gate spacers on sidewalls of the first gate structure;
    partially removing the first gate spacers, leaving portions of the first gate spacers within corners where the fin structure and the first gate structure meet;
    forming second gate spacers on sidewalls of the first gate structure;
    forming a dielectric layer over the fin structure, the first gate structure, and the second gate spacers;
    removing the first gate structure and the portions of the first gate spacers thereby exposing sidewalls of the second gate spacers; and
    forming a second gate structure over the fin structure in a region where the first gate structure and the portions of the first gate spacers have been removed.

2. The method of claim 1 further comprising:
    forming an insulation layer interposed between the first gate structure and the fin structure; and
    forming a gate dielectric layer interposed between the second gate structure and the fin structure.

3. The method of claim 2 further comprising:
    forming an interfacial layer interposed between the gate dielectric layer and the fin structure.

4. The method of claim 3 wherein the interfacial layer is disposed on the fin structure without being disposed on the STI features.

5. The method of claim 3 wherein forming the interfacial layer includes forming silicon oxide, and
    wherein forming the second gate spacers includes depositing silicon nitride.

6. The method of claim 1 wherein providing the substrate includes providing one of a bulk silicon substrate or a silicon-on-insulator (SOI) substrate.

7. The method of claim 1 wherein forming the second gate structure includes depositing a material selected from the group consisting of Al, Cu, and W.

8. A method comprising:
    forming a fin structure on a substrate;
    forming a first gate structure traversing the fin structure;
    forming first gate spacers on sidewalls of the first gate structure,
    partially removing the first gate spacers, leaving a first portion of the first gate spacers at corners where the fin structure and the first gate structure intersect;
    forming second gate spacers on sidewalls of the first gate structure and on sidewalls of the first gate spacers;
    forming a dielectric layer over a top surface of the fin structure;
    removing the first gate structure and the first gate spacers to exposed a region between the sidewalls of the second gate spacers; and
    forming a second gate structure in the region.

9. The method of claim 8, wherein the forming of the second gate structure includes forming a gate dielectric layer interposed between the second gate structure and the fin structure, wherein the gate dielectric layer includes a high-k dielectric material, and
    wherein the forming of the second gate structure includes depositing a material selected from the group consisting of Al, Cu, and W.

10. The method of claim 9 further comprising:
    forming an interfacial layer interposed between the gate dielectric layer and the fin structure.

11. The method of claim 8, wherein the second gate structure has a stepped profile, the stepped profile having a first width at a centerline of a fin of the fin structure, and a second width and a third width at a first distance from the centerline of the fin, the second width being measured at a top portion of the second gate structure and the third width being measured at a bottommost surface of the second gate structure, the first width being less than the third width, the second width being less than the third width.

12. The method of claim 11, wherein the stepped profile has a fourth width at a centerline of a second fin of the fin structure, the fourth width being the same width as the first width.

13. The method of claim 8, wherein the first portion of the first gate spacers does not contact the top surface of the fin structure.

14. The method of claim 8, wherein the second gate structure includes a bottommost surface that is wider than a topmost surface.

15. A method of fabricating a FinFET device, comprising:
    providing a substrate including a fin structure, the fin structure comprising a first fin and a second fin;
    forming a first gate structure over the fin structure;
    forming first gate spacers on sidewalls of the first gate structure, the first gate spacers contacting the fin structure;
    forming second gate spacers on sidewalls of the first gate structure and on sidewalls of the first gate spacers;
    forming a dielectric layer over the fin structure;
    removing the first gate structure and the first gate spacers, wherein the removing of the first gate structure and the first gate spacers includes:
        removing the first gate structure by a first etching process, thereby forming a trench in the dielectric layer; and
        removing the first gate spacers by a second etching process, thereby modifying the trench to have a stepped profile; and
    forming a second gate structure in the trench.

16. The method of claim 15, wherein the second gate structure includes a bottommost surface that is wider than a topmost surface.

17. The method of claim 15 further comprising:
forming an insulation layer interposed between the first gate structure and the fin structure; and
forming a gate dielectric layer interposed between the second gate structure and the fin structure.

18. The method of claim 17 further comprising:
forming an interfacial layer interposed between the gate dielectric layer and the fin structure.

19. The method of claim 15, wherein the second gate structure has a first width at a first portion formed over the first fin, wherein the second gate structure has a second width at a second portion formed between the first fin and the second fin, wherein the first width is different than the second width.

20. The method of claim 15, further comprising partially removing the first gate spacers, leaving a first portion of the first gate spacers at corners where the fin structure and the first gate structure intersect.

* * * * *